US009678429B2

(12) United States Patent
Boukaftane

(10) Patent No.: US 9,678,429 B2
(45) Date of Patent: *Jun. 13, 2017

(54) METHOD OF CREATING HYBRID PRINTING DOTS IN A FLEXOGRAPHIC PRINTING PLATE

(71) Applicant: MacDermid Printing Solutions, LLC, Waterbury, CT (US)

(72) Inventor: Chouaib Boukaftane, Decatur, GA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/829,163

(22) Filed: Aug. 18, 2015

(65) Prior Publication Data

US 2017/0052451 A1   Feb. 23, 2017

(51) Int. Cl.
G03F 7/20 (2006.01)
G03F 7/36 (2006.01)
G03F 7/32 (2006.01)

(52) U.S. Cl.
CPC ............... *G03F 7/36* (2013.01); *G03F 7/20* (2013.01); *G03F 7/32* (2013.01)

(58) Field of Classification Search
CPC ....................................................... G03F 7/20
See application file for complete search history.

(56) References Cited

U.S. PATENT DOCUMENTS

| 3,265,765 A | 8/1966 | Holden et al. |
| 3,867,153 A | 2/1975 | MacLachlan |
| 4,264,705 A | 4/1981 | Allen |
| 4,320,188 A | 3/1982 | Heinz et al. |
| 4,323,636 A | 4/1982 | Chen |
| 4,323,637 A | 4/1982 | Chen et al. |
| 4,369,246 A | 1/1983 | Chen et al. |
| 4,423,135 A | 12/1983 | Chen et al. |
| 4,427,759 A | 1/1984 | Gruetzmacher et al. |
| 4,622,088 A | 11/1986 | Min |
| 5,135,827 A | 8/1992 | Bohm et al. |
| 5,223,375 A | 6/1993 | Berrier et al. |
| 5,262,275 A | 11/1993 | Fan |
| 5,925,500 A | 7/1999 | Yang |
| 6,238,837 B1 | 5/2001 | Fan |

(Continued)

FOREIGN PATENT DOCUMENTS

| EP | 0 456 336 | 11/1991 |
| EP | 0 640 878 | 3/1995 |
| GB | 1 366 769 | 9/1974 |

*Primary Examiner* — Chanceity Robinson
(74) *Attorney, Agent, or Firm* — Carmody Torrance Sandak & Hennessey LLP

(57) ABSTRACT

A method of producing a relief image printing element from a photocurable printing blank. The method includes the steps of a) providing a photocurable printing blank, the photocurable printing blank comprising (i) a backing or support layer; and (ii) one or more photocurable layers disposed on the backing or support layer. The one or more photocurable layers are selectively imaged by exposing the layers to actinic radiation to selectively crosslink and cure portions of the one or more photocurable layers, and then developed to remove uncured portions of the one or more photocurable layers and reveal the relief image therein. The relief image comprises a plurality of relief printing dots, including relief printing dots that have a rounded top and relief printing dots that have a flat top.

10 Claims, 3 Drawing Sheets

(56) References Cited

U.S. PATENT DOCUMENTS

| | | |
|---|---|---|
| 6,403,269 B1 | 6/2002 | Leach |
| 8,772,740 B2 | 7/2014 | Klein et al. |
| 8,820,234 B2 | 9/2014 | Sievers |
| 8,899,148 B2 | 12/2014 | Rudolph |
| 2008/0318161 A1 | 12/2008 | Nakano et al. |
| 2009/0068593 A1 | 3/2009 | Fujiwara et al. |
| 2011/0079158 A1 | 4/2011 | Recchia et al. |
| 2013/0029267 A1 | 1/2013 | Sugasaki |
| 2014/0004466 A1 | 1/2014 | Vest et al. |
| 2014/0057205 A1* | 2/2014 | Choi .................. G03F 7/09 430/286.1 |
| 2014/0322649 A1 | 10/2014 | Choi et al. |

* cited by examiner

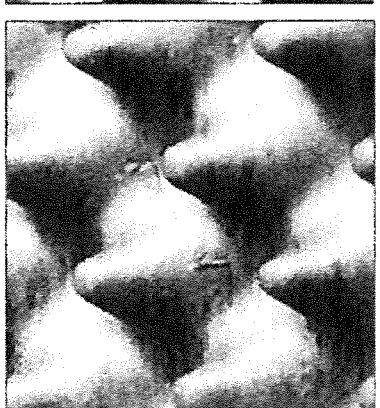
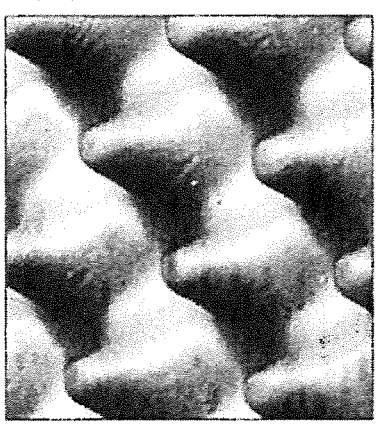
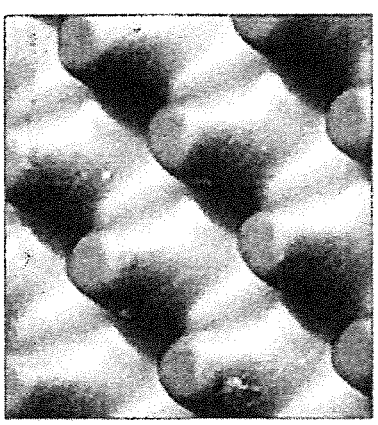
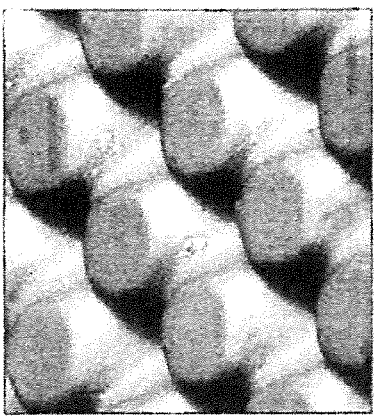
Fig. 1A  Fig. 1B  Fig. 1C  Fig. 1D
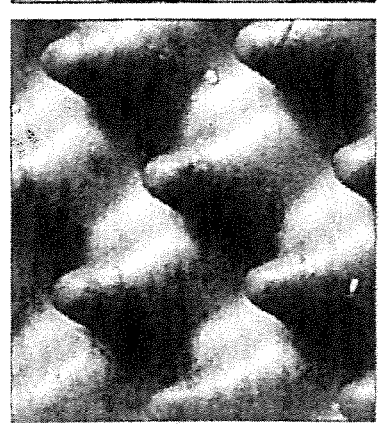
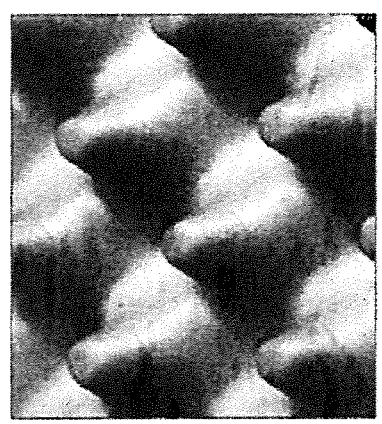
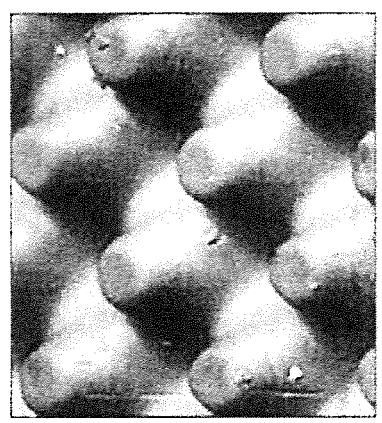
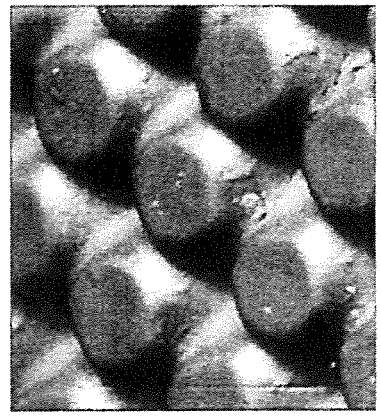
Fig. 2A  Fig. 2B  Fig. 2C  Fig. 2D

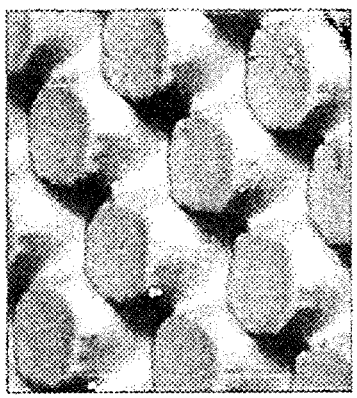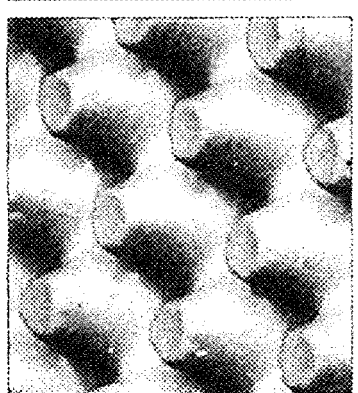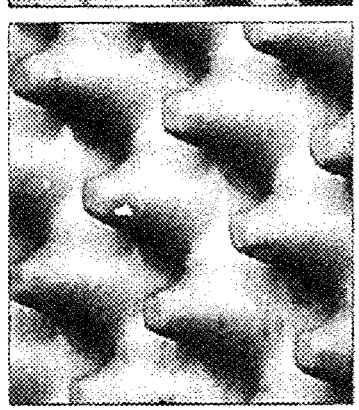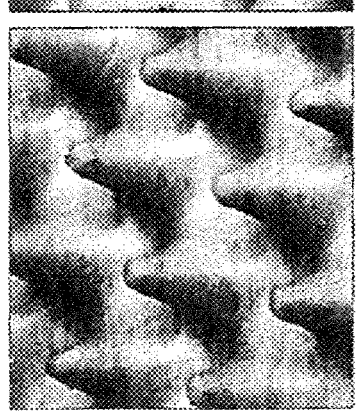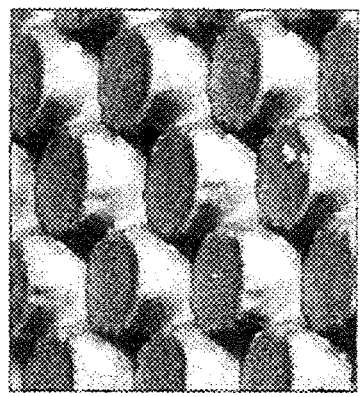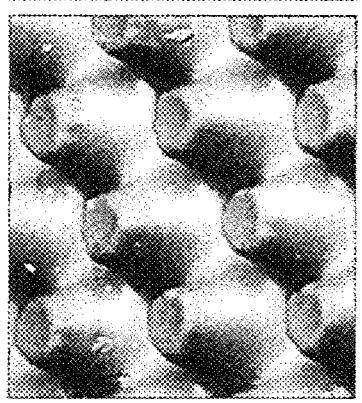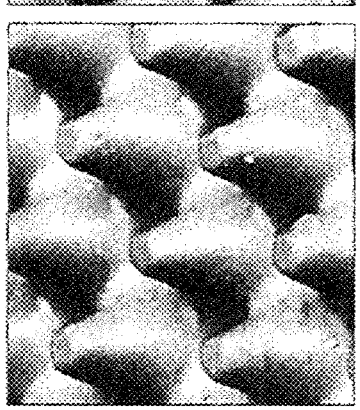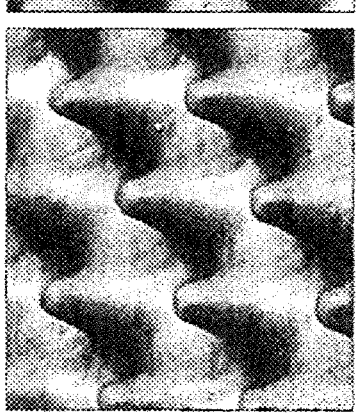

METHOD OF CREATING HYBRID PRINTING DOTS IN A FLEXOGRAPHIC PRINTING PLATE

FIELD OF THE INVENTION

The present invention relates generally to a method of creating hybrid printing dots in a flexographic printing element.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography.

Generally, the plate is somewhat soft, and flexible enough to wrap around a printing cylinder, and durable enough to print over a million copies. Such plates offer a number of advantages to the printer, based chiefly on their durability and the ease with which they can be made. A typical flexographic printing plate as delivered by its manufacturer is a multilayered article made of in order, a backing or support layer; one or more unexposed photocurable layers; optionally a protective layer or slip film; and often, a protective cover sheet. After processing, the resulting surface of the printing plate has three-dimensional relief pattern, which typically comprises a plurality of printing dots that reproduce the image to be printed.

The support (or backing) layer lends support to the plate. The support layer can be formed from a transparent or opaque material such as paper, cellulose film, plastic, or metal. Preferred materials include sheets made from synthetic polymeric materials such as polyesters, polystyrene, polyolefins, polyamides, and the like. One widely used support layer is a flexible film of polyethylene terephthalate.

The photocurable layer(s) can include any of the known photopolymers, monomers, initiators, reactive or non-reactive diluents, fillers, and dyes. As used herein, the term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional relief pattern of cured material. Exemplary photocurable materials include those disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may also be used.

Photocurable materials generally cross-link (cure) and harden through radical polymerization in at least some actinic wavelength region. As used herein, "actinic radiation" is radiation that is capable of polymerizing, crosslinking or curing the photocurable layer. Actinic radiation includes, for example, amplified (e.g., laser) and non-amplified light, particularly in the UV and violet wavelength regions.

The slip film is a thin layer, which protects the photopolymer from dust and increases its ease of handling. In a conventional ("analog") plate making process, the slip film is transparent to UV light, and the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate.

In a "digital" or "direct to plate" process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are then ablated by exposing the masking layer to laser radiation at a selected wavelength and power of the laser. Examples of laser ablatable layers are disclosed, for example, in U.S. Pat. No. 5,925,500 to Yang, et al., and U.S. Pat. Nos. 5,262,275 and 6,238,837 to Fan, the subject matter of each of which is herein incorporated by reference in its entirety.

Processes for forming relief image printing elements typically include the following processing steps:
1) Image generation, which may be mask ablation for digital "computer to plate" printing plates or negative production for conventional analog plates;
2) Back exposure to create a floor layer in the photocurable layer and establish the depth of relief;
3) Face exposure through the mask (or negative) to selectively crosslink and cure portions of the photocurable layer not covered by the mask, thereby creating the relief image;
4) Development to remove unexposed photopolymer by solvent (including water) or thermal development; and
5) If necessary, post exposure and detackification.

Removable coversheets are also typically provided to protect the photocurable printing element from damage during transport and handling. Prior to processing the printing elements, the coversheet(s) are removed and the photosensitive surface is exposed to actinic radiation in an imagewise fashion. Upon imagewise exposure to actinic radiation, polymerization, and hence, insolubilization of the photopolymerizable layer occurs in the exposed areas. Treatment with a suitable developer solvent (or thermal development) removes the unexposed areas of the photopolymerizable layer, leaving a three-dimensional printing relief that can be used for flexographic printing.

As used herein "back exposure" refers to a blanket exposure to actinic radiation of the photopolymerizable layer on the side opposite that which does, or ultimately will, bear the relief. This step is typically accomplished through a transparent support layer and is used to create a shallow layer of photocured material, i.e., the "floor," on the support side of the photocurable layer. The purpose of the floor is generally to sensitize the photocurable layer and to establish the depth of relief.

Following the brief back exposure step (i.e., brief as compared to the imagewise exposure step which follows), an imagewise exposure is performed utilizing a digitally-imaged mask or a photographic negative mask, which is in contact with the photocurable layer and through which actinic radiation is directed.

The type of radiation used is dependent on the type of photoinitiator in the photopolymerizable layer. The digitally-imaged mask or photographic negative prevents the material beneath from being exposed to the actinic radiation and hence those areas covered by the mask do not polymerize, while the areas not covered by the mask are exposed to actinic radiation and polymerize. Any conventional sources of actinic radiation can be used for this exposure step. Examples of suitable visible and UV sources include carbon arcs, mercury-vapor arcs, fluorescent lamps, electron flash units, electron beam units, photographic flood lamps and LEDs.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or thermal development, which typically uses heat plus a blotting material. The resulting surface has a three-dimensional relief pattern, which typically comprises a plurality of dots that reproduces the image to be printed. After the relief image is developed, the resulting relief image printing element may be mounted on a press and printing commenced.

The shape of the dots and the depth of the relief, among other factors, affect the quality of the printed image. In addition, it is very difficult to print small graphic elements such as fine dots, lines and even text using flexographic printing plates while maintaining open reverse text and shadows. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both cases, it is necessary to print very small dot sizes to adequately represent the highlight areas. In addition, it may also be desirable in some instances to also include very small dots on the printing element that do not print but merely support the relief image.

Maintaining small dots on flexographic plates can be very difficult due to the nature of the platemaking process. In digital platemaking processes that use a UV-opaque mask layer, the combination of the mask and UV exposure produces relief dots that have a generally conical shape. The smallest of these dots are prone to being removed during processing, which means no ink is transferred to these areas during printing (i.e., the dot is not "held" on plate and/or on press). Alternatively, if the dots survive processing they are susceptible to damage on press. For example small dots often fold over and/or partially break off during printing, causing either excess ink or no ink to be transferred.

U.S. Pat. No. 8,158,331 to Recchia and U.S. Pat. Pub. No. 2011/0079158 to Recchia et al., the subject matter of each of which is herein incorporated by reference in its entirety, describe a particular set of geometric characteristics that define a flexo dot shape that was found to yield superior printing performance. These geometric characteristics include, but not limited to (1) planarity of the dot surface; (2) shoulder angle of the dot; (3) depth of relief between the dots; and (4) sharpness of the edge at the point where the dot top transitions to the dot shoulder.

Upon UV-curing, the surface properties of a given photopolymer can be quite different from its bulk properties. This is mainly because oxygen inhibition strongly affects the surface layer upon UV exposure, thus disproportionately suppressing the curing reaction in the surface layer compared to the bulk. As a result, the most desirable properties for end-use product performance are not attained. In addition, poor surface cure can significantly alter the size and shape of the relief features formed in the photopolymer by UV curing.

As described for example in U.S. Pat. Pub. No. 2014/0004466 to Vest et al., the subject matter of which is herein incorporated by reference in its entirety, a process has also been developed for digital plating making in which an oxygen barrier membrane is laminated to the top of the one or more photopolymer layers and is imaged through the oxygen barrier membrane to create printing dots having a flat top and sharp dot edges.

Flat tops allow much higher ink transfer volume in the print compared to round tops, especially for solid areas and line work that have been screened with a high frequency pattern. However, for some applications, flat top dots have some disadvantages. For example, screen dots printed with flat tops for low percentage screen dot areas in highlight areas of a print may end up with too much ink transfer.

Thus, it would be desirable to provide an improved method of producing a relief image printing element having both flat top dots and round top dots on the same printing element or vignette in a digital printing plate process without the need for additional processing steps and without the need for specialized equipment or procedures.

SUMMARY OF THE INVENTION

In addition, many printing plate jobs include line work as well as screened areas. Pure flat top structures may not be suitable for use in such jobs without compromising the quality of the screened areas of the job. Too much ink transfer in highlight regions means the lowest printable gray scales are higher than with conventional digital printing with round tops, which limits the gray scale range available. Thus, round tops may be desirable for forming very small halftone dots that do not break off, while flat tops may be desirable for higher ink transfer volume in printing.

It is an object of the present invention to provide an improved photocurable composition for producing a relief image printing element.

It is another object of the present invention to provide an improved photocurable composition that is capable of producing both round top dots and flat top dots on the same printing element.

It is still another object of the present invention to create a hybrid printing element, comprising both round top dots and flat top dots by a digital platemaking process.

To that end, in one embodiment, the present invention relates generally to a method of producing a relief image printing element from a photocurable printing blank, the method comprising the steps of:

a) providing a photocurable printing blank, the photocurable printing blank comprising:
 i) a backing layer; and
 ii) one or more photocurable layers disposed on the backing layer, wherein the one or more photocurable layers comprise a photocurable composition comprising:

1) a binder;
2) one or more monomers;
3) a photoinitiator; and
4) about 0.01 to about 2.0 percent by weight of a material selected from the group consisting of butylated hydroxytoluene; pentaerythritol tetrakis (3-(3,5-ditertbutyl-4-hydroxy phenyl) propionate); octadecyl 3,5 Di-tert-butyl-4-hydroxyhydrocinnamate; pentaerythritol tetrakis (3-(3,5-di-tert-butyl-4-hydroxyphenyl)propionate); oxtadecyl-3(3,5-di-tert-butyl-4-hydroxyphenyl)-propionate; ethylene bis(oxyethylene) bis-(3-(5-tert-butyl-4-hydroxy-m-tolyl_propionate; N,N'-hexane-1,6-diylbis(3-(3,5-di-tert-butyl-4-hydroxyphenylpropionamide); benzenepropopanoic acid, 3,5-bis (1,1-dimethylethyl)-4-hydroxy-C7-C9 branched alkyl esters; 2-(3-tert-Butyl-2-hydroxy-5-methylphenyl)-5-chloro-2H-benzotriazole; 2-(2-Hydroxy-3,5-diperyl-phenyl) benzotriazole and combinations of the foregoing.
b) selectively imaging the one or more photocurable layers to actinic radiation to selectively crosslink and cure portions of the one or more photocurable layers; and
c) developing the at least one photocurable layer to remove uncured portions of the one or more photocurable layers and reveal the relief image therein, said relief image comprising a plurality of relief printing dots;
wherein the relief printing dots comprise dots that have a rounded top and dots that have a flat top.

BRIEF DESCRIPTION OF THE FIGURES

FIGS. 1A-1D depict SEMs of printing dots produced from a photosensitive composition containing 1.92% by weight BHT that has been solvent developed.
FIGS. 2A-2D depict SEMs of printing dots produced from a photosensitive composition containing 0.96% by weight BHT that has been solvent developed.
FIGS. 3A-3D depict SEMs of printing dots produced from a photosensitive composition containing 0.2% by weight BHT that has been solvent developed.
FIGS. 4A-4D depict SEMs of printing dots produced from a photosensitive composition containing 0.05% by weight BHT that has been solvent developed.

DETAILED DESCRIPTION OF THE PREFERRED EMBODIMENTS

Figure 5A:
FIGS. 5A-5D depict SEMs of printing dots produced from a photosensitive composition containing 0.0% by weight BHT that has been solvent developed.

As described herein, traditional methods of producing flexographic relief image printing elements from photopolymer printing blanks typically produce a printing surface containing either round top dots or flat top dots. However, in some instances, it would also be desirable to provide a printing surface that contains both flat top dots and round top dots in the same printing element in a simple and efficient manner.

In one embodiment the present invention relates generally to a method of producing a relief image printing element from a photocurable printing blank, the method comprising the steps of:

a) providing a photocurable printing blank, the photocurable printing blank comprising:
i) a backing layer; and
ii) one or more photocurable layers disposed on the backing layer, wherein the one or more photocurable layers comprise a photocurable composition comprising:
1) a binder;
2) one or more monomers;
3) a photoinitiator; and
4) about 0.01 to about 2.0 percent by weight of a material selected from the group consisting of butylated hydroxytoluene; pentaerythritol tetrakis (3-(3,5-ditertbutyl-4-hydroxy phenyl) propionate); octadecyl 3,5 Di-tert-butyl-4-hydroxyhydrocinnamate; pentaerythritol tetrakis (3-(3,5-di-tert-butyl-4-hydroxyphenyl)propionate); oxtadecyl-3(3,5-di-tert-butyl-4-hydroxyphenyl)-propionate; ethylene bis(oxyethylene) bis-(3-(5-tert-butyl-4-hydroxy-m-tolyl-propionate; N,N'-hexane-1,6-diylbis(3-(3,5-di-tert-butyl-4-hydroxyphenylpropionamide); benzenepropopanoic acid, 3,5-bis (1,1-dimethylethyl)-4-hydroxy-C7-C9 branched alkyl esters; 2-(3-tert-Butyl-2-hydroxy-5-methylphenyl)-5-chloro-2H-benzotriazole; 2-(2-hydroxy-3,5-diperyl-phenyl) benzotriazole and combinations of the foregoing;
b) selectively imaging the one or more photocurable layers to actinic radiation to selectively crosslink and cure portions of the one or more photocurable layers; and
c) developing the at least one photocurable layer to remove uncured portions of the one or more photocurable layers and reveal the relief image therein, said relief image comprising a plurality of relief printing dots;
wherein the relief printing dots comprise dots that have a rounded top and dots that have a flat top.

The inventors of the present invention have found that the inclusion of particular additives in the photocurable layer of the relief image printing element, as described herein, produces relief image printing element that can be tailored to include dots having both a desired shape and depth of relief. More specifically, the inventors of the present invention have found that by choosing particular additives and varying the concentration of these additives in the photopolymerizable composition, that both flat top dots and round top dots can be created in the same relief image printing plate. These dots are referred to herein as hybrid dots. These hybrid dots have a round top below a certain dot size (i.e., below about 1% physical dots). Beyond that dot size, the hybrid dots are flat and have a high resolution, including good edge sharpness, as measured at a point between the flat top surface of the dots and the dot shoulder.

Edge sharpness relates to the presence of a well-defined boundary between the planar dot top and the shoulder and it is generally preferred that the dot edges be sharp and defined. These well-defined dot edges separate the "printing" portion from the "support" portion of the dot, allowing for a more consistent contact area between the dot and the substrate during printing.

Edge sharpness can be defined as the ratio of $r_e$, the radius of curvature (at the intersection of the shoulder and the top of the dot) to p, the width of the dot's top or printing surface. For a truly round-tipped dot, it is difficult to define the exact printing surface because there is not really an edge in the commonly understood sense, and the ratio of $r_e$:p can approach 50%. In contrast, a sharp-edged dot would have a very small value of $r_e$, and $r_e$:p would approach zero. In practice, an $r_e$:p of less than 5% is preferred, with an $r_e$:p of less than 2% being most preferred.

The inventors of the present invention have found that the use of certain additives at certain concentrations can be used to control the shape of the printing dots, including both the flatness and the size of the printing dots. In a preferred embodiment, the additives are selected from phenolic antioxidants, more preferably sterically hindered phenolic additives, including, for example, butylated hydroxyl toluene; pentaerythritol tetrakis(3-(3,5-di-tert-butyl-4-hydroxyphenyl)propionate); octadecyl 3,5-Di-(tert)-butyl-4-hydroxyhydrocinnamate; pentaerythritol tetrakis (3-(3,5-di-tert-butyl-4-hydroxyphenyl)propionate); Oxtadecyl-3 (3,5-di-tert-butyl-4-hydroxyphenyl)-propionate; Ethylene bis (oxyethylene) bis-(3-(5-tert-butyl-4-hydroxy-m-tolyl_propionate; N,N'-hexane-1,6-diylbis(3-(3,5-di-tert-butyl-4-hydroxyphenylpropionamide); Benzenepropopanoic acid, 3,5-bis (1,1-dimethyl-ethyl)-4-hydroxy-C7-C9 branched alkyl esters; 2-(3-tert-Butyl-2-hydroxy-5-methylphenyl)-5-chloro-2H-benzotriazole; 2-(2-Hydroxy-3,5-diperyl-phenyl) benzotriazole. More than one additive may also be used.

As described herein, the concentration of the additive in the photocurable composition is preferably in the range of about 0.01 to about 2.0 percent by weight, more preferably in the range of about 0.05 to about 0.20 percent by weight based on the total weight of the photocurable composition. However, it is contemplated that the concentration of the additive will depend on the particular additive that is used in addition to the other ingredients present in the photocurable composition. Thus, the concentration of additive in the photocurable composition is the concentration that is necessary to achieve the desired result of both round top dots below a certain dot size and flat top dots having high definition and good edge sharpness at the point where the top surface of the dot intersects with the dot shoulder above the certain dot size.

In addition to the additives, the composition of the invention also comprises one or more binders, monomers and plasticizers in combination with one or more photo-initiators.

The binder type is not critical to the photopolymer composition and most, if not all, styrenic copolymer rubbers are usable in the compositions of the invention. Suitable binders can include natural or synthetic polymers of conjugated diolefin hydrocarbons, including 1,2-polybutadiene, 1,4-polybutadiene, butadiene/acrylonitrile, butadiene/styrene, thermoplastic-elastomeric block copolymers e.g., styrene-butadiene-styrene block copolymer, styrene-isoprene-styrene block copolymer, etc., and copolymers of the binders. It is generally preferred that the binder be present in at least an amount of 60% by weight of the photosensitive layer. The term binder, as used herein, also encompasses core shell microgels or blends of microgels and pre-formed macromolecular polymers.

Non-limiting examples of binders that are usable in the compositions of the instant invention include styrene isoprene styrene (SIS), a commercial product of which is available from Kraton Polymers, LLC under the tradename Kraton® D1161; styrene isoprene butadiene styrene (SIBS), a commercial product of which is available from Kraton Polymers, LLC under the tradename Kraton® D1171; styrene butadiene styrene (SBS), a commercial product of which is available from Kraton Polymers, LLC under the tradename Kraton® DX405, and linear triblock copolymers based on styrene and isoprene, a commercial product of which is available from Kraton Polymers, LLC under the Tradename Kraton® D1114 (having a polystyrene content of 19%).

Monomers suitable for use in the present invention are addition-polymerizable ethylenically unsaturated compounds. The photocurable composition may contain a single monomer or a mixture of monomers which form compatible mixtures with the binder(s) to produce clear (i.e., non-cloudy) photosensitive layers. The monomers are typically reactive monomers especially acrylates and methacrylates. Such reactive monomers include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol-200 diacrylate, tetraethylene glycol diacrylate, triethylene glycol diacrylate, pentaerythritol tetraacrylate, tripropylene glycol diacrylate, ethoxylated bisphenol-A diacrylate, trimethylolpropane triacrylate, di-imethylolpropane tetraacrylate, triacrylate of tris(hydroxyethypisocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate, urethanemethacrylate or acrylate oligomers and the like which can be added to the photopolymerizable composition to modify the cured product. Monoacrylates including, for example, cyclohexyl acrylate, isobornyl acrylate, lauryl acrylate and tetrahydrofurfuryl acrylate and the corresponding methacrylates are also usable in the practice of the invention. Especially preferred acrylate monomers include hexanediol di acrylate (HDDA) and trimethylolpropane triacrylate (TMPTA). Especially preferred methacrylate monomers include hexanediol dimethacrylate (HDDMA) and triemethylolpropane trimethacrylate (TMPTA). It is generally preferred that the one or more monomers be present in an amount of at least 5% by weight of the photosensitive layer, more preferably in an amount of at least 10% by weight of the photosensitive layer.

The photopolymer layer optionally, but preferably, contains a compatible plasticizer, which serves to lower the glass transition temperature of the binder and facilitate selective development. Suitable plasticizers include, but are not limited to, dialkyl phthalates, alkyl phosphates, polyethylene glycol, polyethylene glycol esters, polyethylene glycol ethers, polybutadiene, polybutadiene styrene copolymers, hydrogenated, heavy naphthenic oils, hydrogenated, heavy paraffinic oils, and polyisoprenes. Other useful plasticizers include oleic acid, lauric acid, etc. The plasticizer is generally present in an amount of at least 10% by weight, based on weight of total solids of the photopolymer composition. Commercially available plasticizers for use in compositions of the invention include 1,2-polybutadiene, available from Nippon Soda Co. under the tradename Nisso PB B-1000; Ricon 183, which is a polybutadiene styrene copolymer, available from Cray Valley; Nyflex 222B, which is a hydrogenated heavy naphthenic oil, available from Nynas AB;

ParaLux 2401, which is a hydrogenated heavy paraffinic oil, available from Chevron U.S.A., Inc.; and Isolene 40-S, which is a polyisoprene available from Royal Elastomers.

Photoinitiators for the photocurable composition include the benzoin alkyl ethers, such as benzoin methyl ether, benzoin ethyl ether, benzoin isopropyl ether and benzoin isobutyl ether. Another class of photoinitiators are the dialkoxyacetophenones such as 2,2-dimethoxy-2-phenylacetophenone and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to, benzophenone, acetophenone, o-methoxybenzophenone, acenaphthenequinone, methyl ethyl ketone, valerophenone, hexanophenone, alpha-phenylbutyrophenone, p-morpholinopropiophenone, dibenzosuberone, 4-morpholinobenzophenone, 4'-morpholinodeoxybenzoin, p-diacetylbenzene, 4-aminobenzophenone, 4'-methoxyacetophenone, benzaldehyde, alphatetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracene-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7,12 dione, etc. Preferred photoinitiators for use in the photopolymer compositions of the invention include benzyl dimethyl ketal, a commercial product of which is available from BASF under the Tradename Irgacure 651 and α-hydroxyketone, a commercial product of which is available from BASF under the tradename Irgacure 184.

For purposes of coloring the relief-forming layer, a colorant such as a dye or a pigment may be added. This provides enhanced visibility of image areas of the relief image printing element. Various dyes and/or colorants may also optionally be used in the practice of the invention although the inclusion of a dye and/or colorant is not necessary to attain the benefits of the present invention. Suitable colorants are designated "window dyes" which do not absorb actinic radiation in the region of the spectrum that the initiator present in the composition is activatable. The colorants include, for example, CI 109 Red dye, Methylene Violet (CI Basic Violet 5), "Luxol" Fast Blue MBSN (CI Solvent Blue 38), "Pontacyl" Wool Blue BL (CI Acid Blue 59 or CI 50315), "Pontacyl" Wool Blue GL (CI Acid Blue 102 or CI 50320), Victoria Pure Blue BO (CI Basic Blue 7 or CI 42595), Rhodamine 3 GO (CI Basic Red 4), Rhodamine 6 GDN (CI Basic Red 1 or CI 45160), 1,1'-diethyl-2,2'-cyanine iodide, Fuchsine dye (CI 42510), Calcocid Green S (CI 44090) and Anthraquinone Blue 2 GA (CI Acid Blue 58), etc. The dyes and/or colorants must not interfere with the imagewise exposure.

Other additives including antiozonants, fillers or reinforcing agents, thermal polymerization inhibitors, UV absorbers, etc. may also be included in the photopolymerizable composition, depending on the final properties desired. Such additives are generally well known in the art.

Suitable fillers and/or reinforcing agents include immiscible, polymeric or nonpolymeric organic or inorganic fillers or reinforcing agents which are essentially transparent at the wavelengths used for exposure of the photopolymer material and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful in improving the strength of the elastomeric layer, reducing tack and, in addition, as coloring agents.

As described herein, the photocurable composition is formed into one or more photocurable layers on a backing or support layer. The one or more photocurable layers are then selectively imaged by exposing the one or more photocurable layers to actinic radiation to selectively crosslink and cure portions of the one or more photocurable layers.

In one embodiment, the one or more photocurable layers are selectively exposed to actinic radiation by disposing a laser ablatable mask layer on the at least one photocurable layer, which is then selectively ablate to create an in situ negative of the desired image in the laser ablatable mask layer. In another embodiment, a conventional negative may also be used. Thereafter, the one or more photocurable layers are imaged through the in situ negative or conventional negative to selectively crosslink and cure portions of the one or more photocurable layers. In still another embodiment, a direct write laser may be used to create the desired relief image in the one or more photocurable layers without the need for a mask.

Once the one or more photocurable layers have been imaged to create the desired relief image therein, the one or more photocurable layers are developed to remove uncured portions of the at least one photocurable layer and reveal the three-dimensional relief image therein. The development step may include either solvent development or thermal development.

In addition, an oxygen barrier layer may be laminated to the top of the one or more photocurable layers or the laser ablatable mask layer on top of the one or more photocurable layers as described in U.S. Pat. Pub. No. 2014/0004466 to Vest et al., the subject matter of which is herein incorporated by reference in its entirety. In this instance, the printing element is imaged through the oxygen barrier membrane to create printing dots having high resolution, including both a flat top and sharp dot edges above a certain size. However, the use of the particular antioxidant at the particular concentration also produces round top dots below a certain size that are also of a height that is less than that of the flat top dots. In other words, the presence of the antioxidant in the composition as described herein produces dots that have a round top below a certain size and wherein the dots have a height that is less than that of the flat top dots.

For example, the round top dots may have a height that is no more than about 98% of the height of the flat top dots, more preferably, no more than about 95% of the height of the flat top dots, and most preferably no more than 90% of the height of the flat top dots on the printing plate. This may also depend on the particular size of the round top dots. Thus, larger round top dots (i.e., round top dots that are about 1% dots) may have a height that is substantially similar to that of the flat top dots, while smaller round top dots may have a height that is less than that of the flat top dots. Thus, in the instance that the round top dots have a height that is less than that of the flat top dots, the round top dots would not transfer ink and would simply be used to provide support for the flat top printing dots on the relief image printing plate. The round top dots described herein preferably do not transfer ink and the presence of these fine round top dots makes it easier to support highlight dots and other features on the printing plate.

After development and any desirable post-development processing steps, the printing element comprises a three dimensional relief image comprising a plurality of relief printing dots, including both round top dots and flat top dots.

EXAMPLE

Figure 5B:
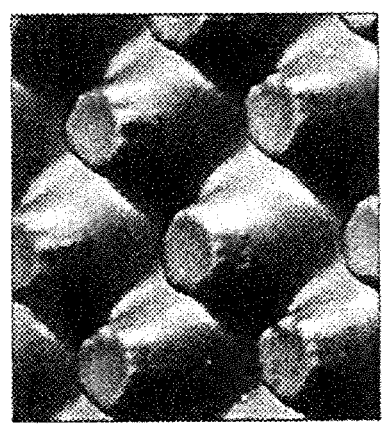
Figure 5C:
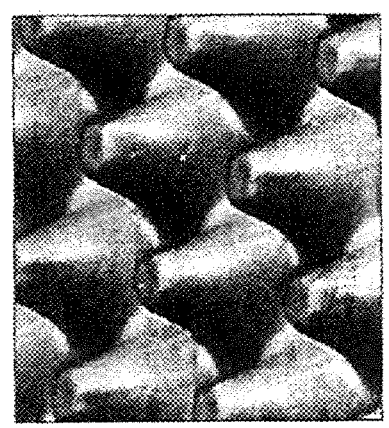
Figure 5D:
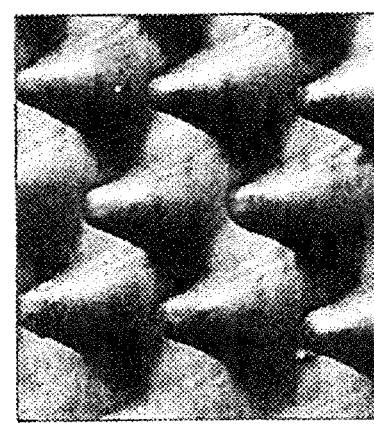

A series of photocurable compositions was prepared using the components set forth below in Table 1. The concentration of the BHT was varied between about 0 and about 2% by weight while the remaining ingredients remained constant. As shown in FIGS. 1A-1D through 5A-5D, the concentration of BHT in the photocurable composition was 0, 0.05, 0.2, 0.96 and 1.92% by weight.

TABLE 1

| Ingredient | Concentration (% by Wt.) |
|---|---|
| Binder (Kraton D1114) | 67 |
| HDDA | 15 |
| PB1000 | 23 |
| Irgacure 651 | 3 |
| Tinuvin 1130 | 0.075 |
| BHT | 0.1-2.0 |
| Primasol red | 0.01 |

The prepared photocurable compositions were disposed on a backing layer and imagewise exposed to actinic radiation to selectively crosslink and cure the photocurable compositions in the desired relief pattern, including 1%, 10%, 20% and 50% dots. Thereafter, the photocurable compositions were solvent developed to remove uncured portions of the photocurable composition and reveal the relief image. SEMs of the resulting printing dots are shown in FIGS. 1A-1D through 5A-5D.

As seen in FIGS. 1A-1D, higher concentrations of BHT in the photocurable composition (i.e., 1.92% by weight) did not yield printing dots having sharp edges as compared with the formulations using a smaller percentage of BHT. While the smallest dots do exhibit a round top as seen in FIG. 1A, the larger dots at 10%, 20% and 50% respectively, do not have sharp edges at a point where the top of the dots meet the dot shoulder and also do not exhibit a good depth of relief. Thus, this higher concentration of BHT produced printing dots which did not have good resolution at the larger dot size and in fact all of the printing dots exhibited a somewhat rounded appearance.

FIGS. 2A-2D illustrate printing dots having a lower concentration of BHT in the photocurable compositions (0.96% by weight) and that exhibited printing dots have sharper edges as compared with the printing dots shown in FIGS. 1A-1D. While the smallest dots do exhibit a rounded top as seen in FIG. 2A, the larger dots have slightly sharper edges but still have a somewhat rounded appearance. In addition, while the depth of relief is better than what was seen in FIGS. 1A-1D, the depth of relief is still not sufficient.

FIGS. 3A-3D illustrate printing dots having a BHT concentration of 0.20 percent by weight. As seen in FIG. 3A, the smallest dots exhibit a rounded appearance, but the remaining dots at 10%, 20% and 50% respectively, all exhibit a flat top with sharp edges and a good depth of relief. In addition, the smallest dots also exhibit a height that is slightly less than that of the flat top dots.

FIGS. 4A-4D illustrate printing dots having a BHT concentration of 0.05 percent by weight. As seen in FIG. 4A, the smallest dots exhibit a rounded appearance, but the remaining dots at 10%, 20% and 50% respectively, all exhibit a flat top with sharp edges and a good depth of relief. In addition, the smallest dots also exhibit a height that is slightly less than that of the flat top dots.

Finally, FIGS. 5A-5D illustrate printing dots having a BHT concentration of 0.0 percent by weight. As seen in Figure % A, the smallest dots exhibit a rounded appearance. However, the remaining dots at 10%, 20% and 50% respectively do not exhibit good edge definition at a point where the top surface of the dots meet the dot shoulder. Thus, these printing dots would not produce a good result when used for printing.

Thus, it can be seen that the presence of specific additives at specific concentrations is capable of producing a hybrid relief structure in which dots below a certain size exhibit a rounded appearance and may be slightly shorter in height than larger flat top dots on the same printing element. Thus, the present invention demonstrates the ability to provide both round top dots and flat top dots on the same printing element in a consistent and efficient manner.

What is claimed is:
1. A method of producing a relief image printing element from a photocurable printing blank, the method comprising the steps of:
  a) providing a photocurable printing blank, the photocurable printing blank comprising:
    i) a backing or support layer; and
    ii) one or more photocurable layers disposed on the backing or support layer, wherein the one or more photocurable layers comprise a photocurable composition comprising:
      1) a binder;
      2) one or more monomers;
      3) a photoinitiator; and
      4) 0.01 to 2.0 percent by weight of an additive selected from the group consisting of butylated hydroxytoluene; pentaerythritol tetrakis (3-(3,5-di-tert-butyl-4-hydroxy phenyl) propionate); octadecyl 3,5 Di-(tert)-butyl-4-hydroxyhydrocinnamate; pentaerythritol tetrakis (3-(3,5-di-tert-butyl-4-hydroxyphenyl)propionate); oxtadecyl-3(3,5-di-tert-butyl-4-hydroxyphenyl)-propionate; ethylene bis(oxyethylene) bis-(3-(5-tert-butyl-4-hydroxy-m-tolyl-propionate; N,N'-hexane-1,6-diylbis(3-(3,5-di-tert-butyl-4-hydroxyphenylpropionamide); benzenepropanoic acid, 3,5-bis (1,1-dimethyl-ethyl)-4-hydroxy-C7-C9 branched alkyl esters; 2-(3-tert-Butyl-2-hydroxy-5-methylphenyl)-5-chloro-2H-benzotriazole; 2-(2-Hydroxy-3,5-diperyl-phenyl) benzotriazole and combinations of the foregoing;
  b) selectively imaging the one or more photocurable layers by exposing the one or more photocurable layers to actinic radiation to selectively crosslink and cure portions of the one or more photocurable layers; and
  c) developing the one or more photocurable layers to remove uncured portions of the one or more photocurable layers and reveal a relief image therein, said relief image comprising a plurality of relief printing dots;
  wherein the presence of the additive at the particular concentration produces relief printing dots having a rounded top below a certain size and relief printing dots having a flat top and a high resolution above the certain size, and
  wherein the relief printing dots that have the rounded top are shorter in height that the relief printing dots having the flat top.

2. The method according to claim 1 wherein the additive is present in the one or more photocurable layers at a concentration of between 0.05% and 0.20% by weight, based on the total weight of the composition of the photocurable composition.

3. The method according to claim 1, wherein the additive is butylated hydroxytoluene.

4. The method according to claim 1, wherein the printing dots below the certain size are printing dots of size less than 1%.

5. The method according to claim 1, wherein the round top printing dots have a height that is less than 98% of the height of the flat top dots on the relief image printing element.

6. The method according to claim 1, wherein the round top printing dots have a height that is less than 95% of the height of the flat top dots on the relief image printing element.

7. The method according to claim 6, wherein the round top printing dots have a height that is less than 90% of the height of the flat top dots on the relief image printing element.

8. The method according to claim 1, wherein the developing step comprises solvent development.

9. The method according to claim 1, wherein the developing step comprises thermal development.

10. The method according to claim 1, wherein the flat top printing dots have good edge sharpness at a point where a top surface of the printing dot intersects a shoulder of the printing dot.

* * * * *